United States Patent [19]

Imai et al.

[11] Patent Number: 5,717,363
[45] Date of Patent: Feb. 10, 1998

[54] OSCILLATION CIRCUIT AND OSCILLATION METHOD

[75] Inventors: Tadashi Imai, Chiba; Kozo Kobayashi, Kanagawa, both of Japan

[73] Assignee: Sony Corporation, Tokyo, Japan

[21] Appl. No.: 721,231

[22] Filed: Sep. 26, 1996

[30] Foreign Application Priority Data

Oct. 6, 1995 [JP] Japan ................... 7-259611

[51] Int. Cl.$^6$ ................................. H03B 5/30
[52] U.S. Cl. ...................... 331/107 A; 331/175
[58] Field of Search ............... 331/107 R, 107 A, 331/116 R, 116 FE, 117 R, 117 FE, 175

[56] References Cited

U.S. PATENT DOCUMENTS

| | | | |
|---|---|---|---|
| 3,787,612 | 1/1974 | DeVries et al. | 178/5.8 AF |
| 5,016,260 | 5/1991 | Masuda | 331/107 A X |
| 5,568,095 | 10/1996 | Hill | 331/107 A X |

FOREIGN PATENT DOCUMENTS

| | | | |
|---|---|---|---|
| 0220914 | 5/1987 | European Pat. Off. | H03B 5/12 |
| 0335493 | 10/1989 | European Pat. Off. | H03B 5/32 |
| 0351153 | 1/1990 | European Pat. Off. | H03C 3/22 |
| 8902673 | 3/1989 | WIPO | 331/107 A |

*Primary Examiner*—David Mis
*Attorney, Agent, or Firm*—Jay H. Maioli

[57] ABSTRACT

An oscillation circuit and an oscillation method for generating a high-frequency signal in which NPN transistors are differentially connected to each other. The signal output from the collector of a first NPN transistor is positively fed back to the base of a second NPN transistor via a first capacitor, and the signal output from the collector of the second NPN transistor is positively fed back to the base of the first NPN transistor via a second capacitor. A one-port-type SAW resonator is connected to the collectors of the NPN transistors via the capacitors for blocking the flow of direct current. Thus, it becomes possible to generate a high-frequency signal with a high degree of accuracy.

16 Claims, 3 Drawing Sheets

OSCILLATION CIRCUIT AND OSCILLATION METHOD

BACKGROUND OF THE INVENTION

1. Field of the Invention

The present invention relates to an oscillation circuit and an oscillation method and, more particularly, to an oscillation circuit and an oscillation method in which signals having a high frequency can be generated without adjustments.

2. Description of the Related Art

FIG. 3 shows an example of the construction of an oscillation circuit. In this example, the emitter of an NPN transistor 3 is grounded via a resistor 4, and a capacitor 6 is connected in parallel to the resistor 4. Further, a capacitor 5 is connected between the base and the emitter of the NPN transistor 3. A resistor 1 and a resistor 2 are connected between a terminal $T_3$ which is connected to a predetermined voltage source and the ground, with the connection point of the resistor 1 and the resistor 2 being connected to the base of the NPN transistor 3. Each of these resistors 1, 2 and 4 supplies a predetermined bias voltage to the NPN transistor 3.

Further, connected to the base of the NPN transistor 3 is a one-port-type SAW (Surface Acoustic Wave) resonator 9 via a capacitor 7 for blocking the flow of direct current. In addition, a terminal $T_3$ is grounded via a capacitor 8.

The one-port-type SAW resonator 9 is formed as shown in, for example, FIG. 4, and the equivalent circuit thereof is formed as shown in FIG. 5.

More specifically, a parallel circuit of (i) a series circuit formed of a resistor 21, a coil 22 and a capacitor 23 and (ii) a capacitor 24 is connected between terminals $T_1$ and $T_2$. This capacitor 24 is a terminal-to-terminal capacitance of the one-port-type SAW resonator 9.

This one-port-type SAW resonator 9 substantially functions as an inductance when the conditions described below are satisfied, where $L_{22}$, $C_{23}$, $C_{24}$ and $R_{21}$ are the inductance of the coil 22, the capacitance of the capacitor 23, the capacitance of the capacitor 24 and the resistance value of the resistor 21, respectively:

$$\omega L_{22} > 1/(\omega C_{23}) = 1/(\omega C_{24}) = R_{21}$$

That is, when the one-port-type SAW resonator 9 satisfies the above-described conditions and substantially functions as an inductance (coil), the circuit of FIG. 3 forms a Colpitts oscillation circuit and performs an oscillation operation.

In the oscillation circuit shown in FIG. 3, a two-port-type SAW resonator 43 shown in FIGS. 7 and 8 and to be described later may be used instead of the one-port-type SAW resonator 9 shown in FIGS. 4 and 5.

FIG. 6 shows an example of the construction of another oscillation circuit. In this example, the output of an amplifier 41 is fed to the two-port-type SAW resonator 43 via a capacitor 42. Further, the output of the two-port-type SAW resonator 43 is input to the amplifier 41 via a capacitor 44.

The amplifier 41 is contained in an IC, and the inductance components, such as a bonding wire present between each terminal of the IC and the built-in chip, form a coil 45.

The two-port-type SAW resonator 43 has terminals $T_{11}$ and $T_{12}$ for input/output purposes and terminal $T_{13}$ for grounding purposes, as shown in, for example, FIG. 7. FIG. 8 shows an equivalent circuit of such a two-port-type SAW resonator 43.

That is, the terminal $T_{11}$ is connected to one of the terminals of one of the windings of an equivalent transformer 55 via a resistor 52, a coil 53 and a capacitor 54. The other terminal of the winding of the equivalent transformer 55 is connected to the terminal $T_{13}$. The terminal $T_{11}$ is connected to the terminal $T_{13}$ via a capacitor 51.

The terminal $T_{12}$ is connected to the terminal $T_{13}$ via a parallel circuit of the other winding of the equivalent transformer 55 and a capacitor 56.

The two-port-type SAW resonator 43 substantially functions as a delay phase circuit and is formed to be able to select delay phase signals of 0 and 180 degrees mainly by the coil 53 and the equivalent transformer 55.

Therefore, the output of the amplifier 41 is input to the two-port-type SAW resonator 43 via the capacitor 42, and a signal whose phase is delayed 0 or 180 degrees is input from the two-port-type SAW resonator 43 via the capacitor 44 to the amplifier 41, causing this circuit to oscillate.

However, the above-described oscillation circuit shown in FIG. 3 performs an unbalanced operation. As a result, in order to suppress leakage of the oscillation signal (spurious signal), a power terminal $T_3$ must be grounded in a high-frequency manner by the capacitor 8 so as to decrease the impedance thereof and stabilize the circuit. Also, it is necessary to shield the entire oscillation circuit. Furthermore, there are problems, for example, since the degree of balance is poor, loopback of signals occurs, and therefore in order to generate a stable signal of a predetermined frequency without being affected by temperature change or aging, an adjustment operation is necessary.

Meanwhile, since the oscillation circuit shown in FIG. 6 also performs an unbalanced operation, countermeasures for factors which obstruct the formation of ICs of a small size and integration of ICs must be performed, for example, independent power terminals are provided to make high-frequency grounding easy, or the number of parallel grounding terminals is increased. As a result, only signals of a frequency of, for example, 100 MHz, can be generated, and there is a problem in that it is difficult to generate a stable signal of a frequency higher than that frequency without being affected by temperature change or aging.

SUMMARY OF THE INVENTION

The present invention has been achieved in view of such circumstances and aims to generate a stable signal of a higher frequency.

The oscillation circuit described in claim 1 comprises: a differential amplifier having at least a pair of active elements which are differentially connected; a positive feedback circuit for positively feeding back the output of the differential amplifier to the input thereof; and a one-port-type SAW resonator connected between the pair of active elements.

The oscillation method described in claim 13 comprises the steps of: positively feeding back the output of a differential amplifier having at least a pair of active elements which are differentially connected to the input thereof; and causing a one-port-type SAW resonator connected between the pair of active elements to perform an oscillation operation.

In the oscillation circuit described in claim 1, the differential amplifier includes at least a pair of active elements which are differentially connected, a positive feedback circuit for positively feeding back the output of the differential amplifier to its input, and a one-port-type SAW resonator is connected between a pair of active elements.

In the oscillation method described in claim 13, the output of a differential amplifier having at least a pair of active elements which are differentially connected is positively fed back to the input thereof, and a one-port-type SAW resonator connected between the pair of active elements is caused to perform an oscillation operation.

The above and further objects, aspects and novel features of the invention will become more apparent from the following detailed description when read in connection with the accompanying drawings.

DESCRIPTION OF THE PREFERRED EMBODIMENTS

Figure 1:
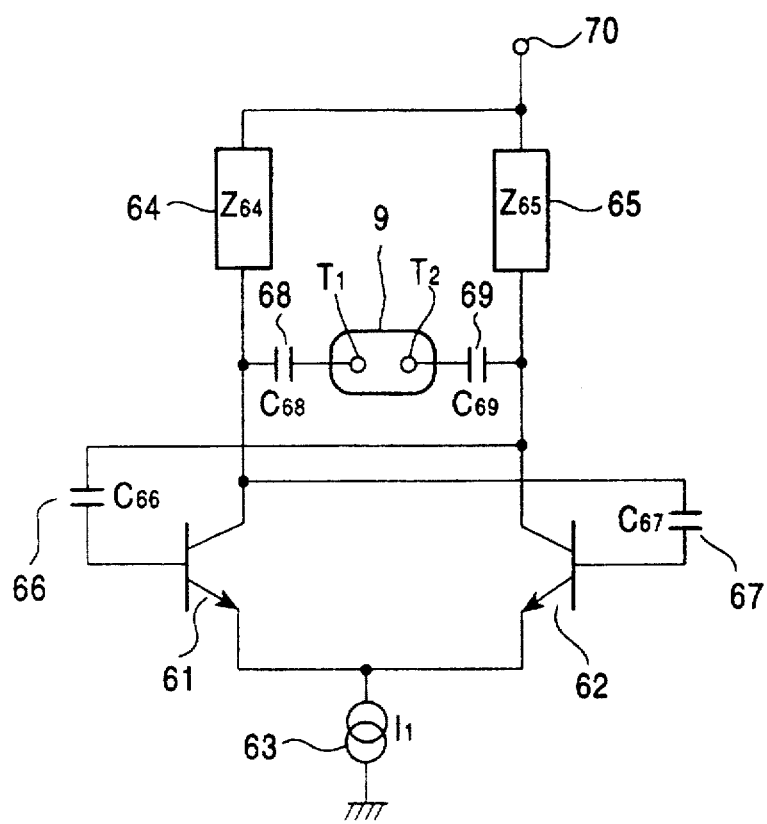
FIG. 1 is a circuit diagram illustrating the construction of an embodiment of an oscillation circuit of the present invention.

FIG. 1 is a circuit diagram illustrating the construction of an embodiment of an oscillation circuit of the present invention (however, the illustration of the biases of the transistors 61 and 62 are omitted). In this embodiment, the emitters of NPN transistors 61 and 62 serving as bipolar transistors are connected in common, with the common connection point being grounded via a constant-current circuit 63. The collector of the NPN transistor 61 is connected to a power terminal 70 via a load impedance 64, and the collector of the NPN transistor 62 is connected to the power terminal 70 via a load impedance 65. That is, the NPN transistor 61 and the NPN transistor 62 are differentially connected to form a differential amplifier.

Also, the collector of the NPN transistor 61 is connected to the base of the NPN transistor 62 via a capacitor 67, and the collector of the NPN transistor 62 is connected to the base of the NPN transistor 61 via a capacitor 66. That is, one of the outputs of the differentially connected NPN transistors 61 and 62 is positively fed back to the input of the other transistor. The capacitors 66 and 67 form a positive feedback circuit for this purpose.

Figure 4:
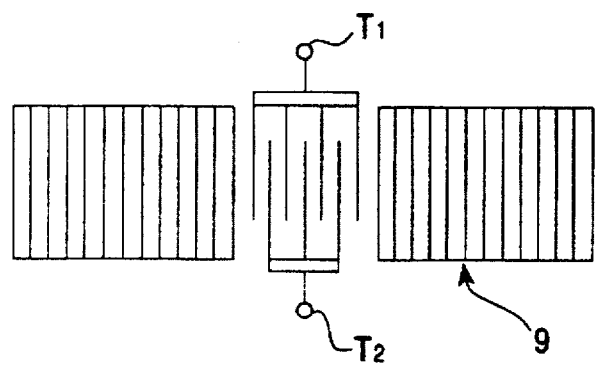
FIG. 4 shows the construction of a one-port-type SAW resonator.
Figure 5:
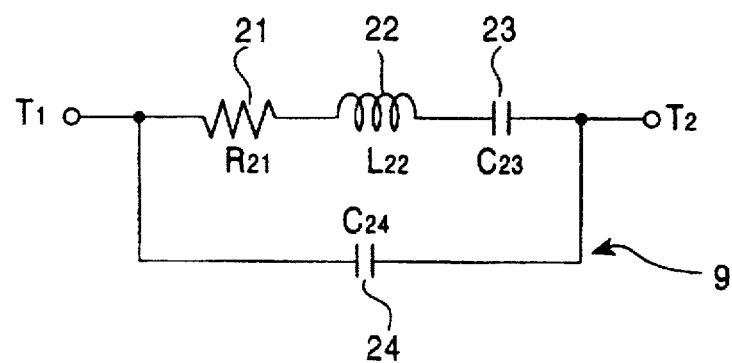
FIG. 5 is a circuit diagram illustrating an equivalent circuit of the example of FIG. 4.
Figure 6:
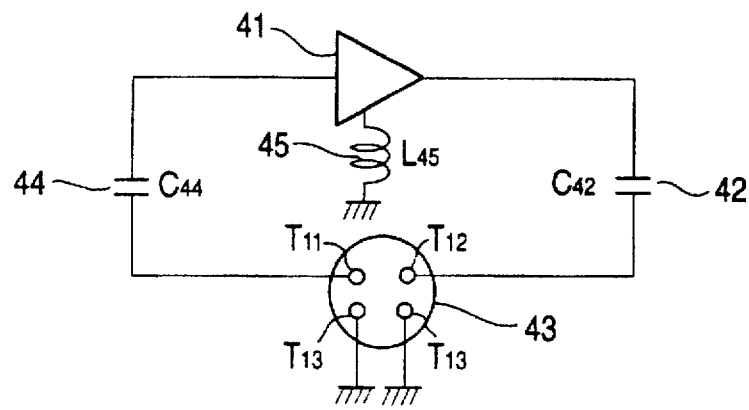
FIG. 6 is a circuit diagram illustrating an example of the construction of another oscillation circuit.
Figure 7:
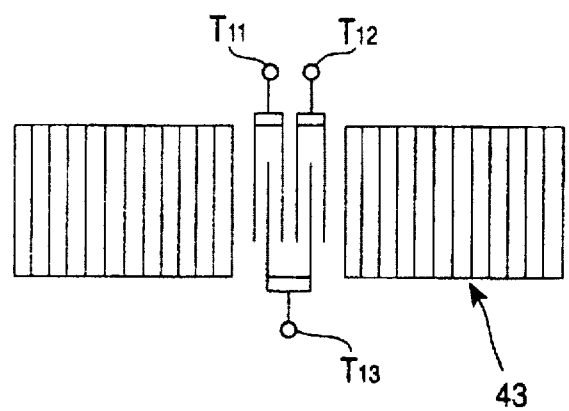
FIG. 7 shows the construction of a two-port-type SAW resonator.
Figure 8:
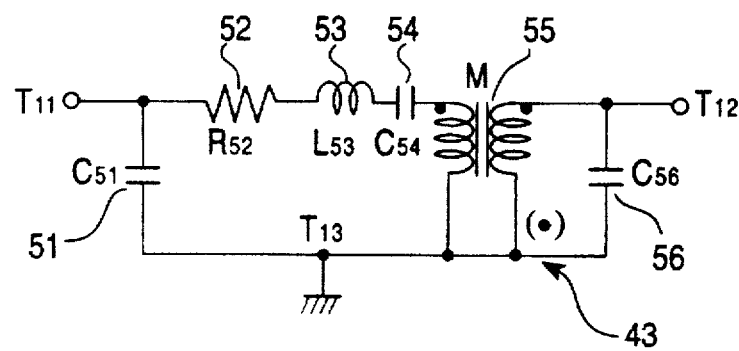
FIG. 8 is a circuit diagram illustrating an equivalent circuit of the example of FIG. 7.

Further, the collectors of the NPN transistors 61 and 62 are connected to the terminals $T_1$ and $T_2$ of the one-port-type SAW resonator 9 via capacitors 68 and 69 for blocking the flow of direct current, respectively. The one-port-type SAW resonator 9, as described above, is formed in such a shape as that shown in FIG. 4, and the equivalent circuit thereof is formed as shown in FIG. 5.

The output of the collector of the NPN transistor 61 is positively fed back to the base of the NPN transistor 62 via the capacitor 67. Also, the output of the collector of the NPN transistor 62 is positively fed back to the base of the NPN transistor 61 via a capacitor 66. As a result, this oscillation circuit substantially oscillates in a parallel resonance mode defined substantially by the values ($C_{24}$ and $L_{22}$) of the capacitor 24 and the coil 22 of the one-port-type SAW resonator 9.

When it is assumed that the parameters of the NPN transistors 61 and 62 are the same, the values of the load impedances 64 and 65 are equal to each other, the values of the capacitors 68 and 69 are equal to each other, and the values of the capacitors 66 and 67 are equal to each other ($Z_{64}=Z_{65}$, $C_{68}=C_{69}$, and $C_{66}=C_{67}$), and this oscillation circuit reaches a completely balanced state. Since a completely balanced state is reached, in the power terminal 70 and the emitters of the NPN transistors 61 and 62, the opposite-phase amplitude components are canceled with each other, and they reach a virtually grounded state. Therefore, an oscillation circuit which does not require a high-frequency grounding terminal for suppressing a spurious signal and having a small amount of leakage can be realized.

Also, since a completely balanced circuit is formed, adjustments are not required, and an oscillation operation can be performed in a stable manner and with a high degree of accuracy regardless of temperature change or aging.

For example, it is required that the second intermediate frequency signal in a digital television broadcast have a high frequency of 480 MHz, and its accuracy be in the range of ±100 kHz. According to the embodiment of FIG. 1, it is possible to generate such a high-frequency signal with the required accuracy and without adjustments.

When the circuit shown in FIG. 5 is formed from parts of discrete resistors, coils and capacitors in place of the one-port-type SAW resonator 9, the circuit is affected by temperature change, aging or the like, and it becomes difficult to generate a high-frequency signal with a high degree of accuracy. Therefore, it becomes necessary to use a one-port-type SAW resonator.

Figure 2:
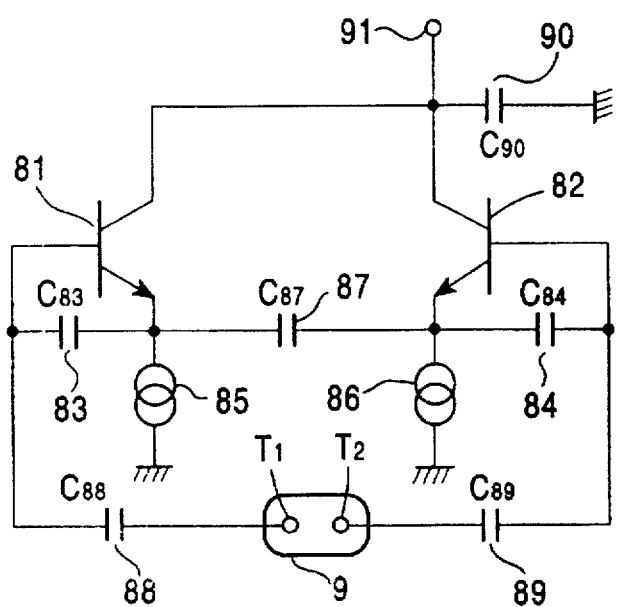
FIG. 2 is a circuit diagram illustrating the construction of another embodiment of the oscillation circuit of the present invention.

FIG. 2 shows the construction of a second embodiment of an oscillation circuit of the present invention. In this embodiment, the collector of an NPN transistor 81 is connected to a power terminal 91, and the emitter thereof is connected to a constant-power source 85. Further, the collector of an NPN transistor 82 is also connected to the power terminal 91, and the emitter thereof is connected to a constant-power source 86. Furthermore, the emitters of the NPN transistors 81 and 82 are connected to each other via a capacitor 87, and thus these transistors form a differential amplifier.

Further, in this embodiment, the signal output from the emitter of the NPN transistor 81 is positively fed back to the base of the NPN transistor 81 via a capacitor 83, and the signal output from the emitter of the NPN transistor 82 is positively fed back to the base of the NPN transistor 82 via a capacitor 84. Furthermore, terminals $T_1$ and $T_2$ of the one-port-type SAW resonator 9 are connected between the bases of the NPN transistors 81 and 82 via the capacitors 88 and 89 for blocking the flow of direct current, respectively.

Figure 3:
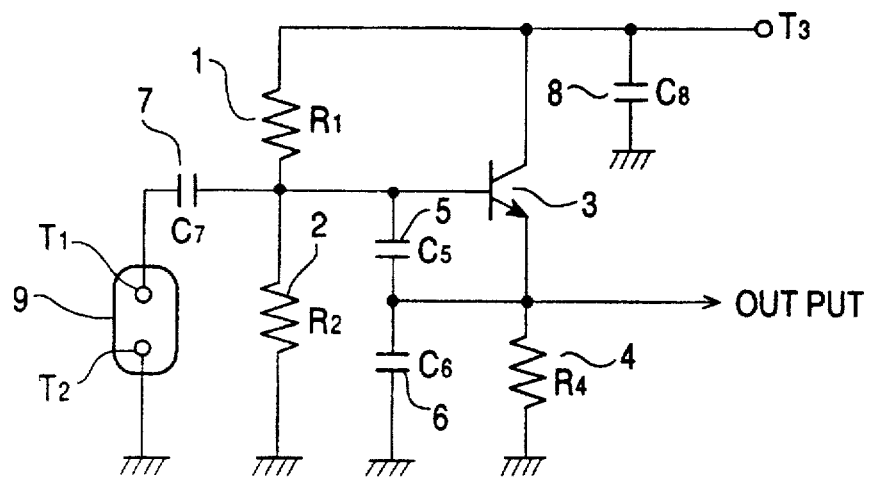
FIG. 3 is a circuit diagram illustrating the construction of the oscillation circuit.

In this embodiment also, the capacitances of the capacitors 88 and 89 are equal to each other, and the capacitances of the capacitors 83 and 84 are equal to each other ($C_{88}=C_{89}$, and $C_{83}=C_{84}$), and if the parameters of the constant-current sources 85 and 86, and the NPN transistors 81 and 82 are made to be the same, a completely balanced state is reached, and oscillation amplitude does not occur in the collectors of the NPN transistors 81 and 82. Therefore, in this case, a capacitor 90 (functions in the same way as the capacitor 8 in FIG. 3) for grounding a power terminal 91, such as that shown in FIG. 2, is not required.

In this embodiment also, by using a differential amplifier and a one-port-type SAW resonator and by using elements having the same parameters as those of the first embodiment, a completely balanced condition is set. Thus, it becomes possible to generate a high-frequency signal without adjustments and with a high degree of accuracy.

These oscillation circuits are suitable for a case in which they are contained in a high-frequency IC. When, in particular, the impedance to the power source and the grounding conductor cannot be sufficiently lowered, the oscillation circuits may be used in a case in which a high-frequency signal is generated with a high degree of accuracy and without adjustments.

Although in the above-described embodiment an NPN transistor is used as an active element which constitutes a differential amplifier, it is also possible to use a PNP transistor or an FET.

As has been described up to this point, according to the oscillation circuit described in claim 1 and the oscillation method described in claim 13, since the output of the differential amplifier is positively fed back to its input, and a one-port-type SAW resonator connected between a pair of active elements is caused to perform an oscillation operation, it becomes possible to generate a high-frequency signal without adjustments and with a high degree of accuracy without being affected by temperature change and aging. Therefore, the present invention may be applied to, for example, a case in which a second intermediate frequency signal of a digital broadcast satellite is generated.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An oscillation circuit for generating a high-frequency signal, said oscillation circuit comprising:
   a differential amplifier having at least a pair of active elements which are differentially connected;
   a positive feedback circuit for positively feeding back an output of said said differential amplifier to an input of said differential amplifier; and
   a one-port-type SAW resonator connected between said pair of active elements of said differential amplifier.

2. The oscillation circuit according to claim 1, wherein said at least a pair of active elements are a pair of bipolar transistors, each one of said bipolar transistors having a collector, an emitter, and a base.

3. The oscillation circuit according to claim 2, wherein said one-port-type SAW resonator is connected between the collectors of said pair of said bipolar transistors.

4. The oscillation circuit according to claim 3, wherein said one-port-type SAW resonator is connected between the collectors of said pair of bipolar transistors via a respective pair of capacitors for blocking a flow of direct current to said one-port-type SAW resonator.

5. The oscillation circuit according to claim 3, wherein said positive feedback circuit comprises a first capacitor which connects the collector of a first one of said bipolar transistors to the base of a second one of said bipolar transistors; and a second capacitor which connects the collector of said second one of said bipolar transistors to the base of said first one of said bipolar transistors.

6. The oscillation circuit according to claim 3, further comprising a constant current circuit, wherein the collectors of said pair of bipolar transistors are each connected to a power source via a respective pair of load impedances, and the emitters of said pair of bipolar transistors are connected in common, with a common connection point being grounded via said constant-current circuit.

7. The oscillation circuit according to claim 3, further comprising a pair of load impedances wherein said one-port-type SAW resonator is connected between the collectors of said pair of bipolar transistors via a respective first pair of capacitors for blocking a flow of direct current to said one-port-type SAW resonator, said positive feedback circuit comprises a second pair of capacitors for positive feedback, each for connecting one of the collectors of said pair of bipolar transistors to the base of the other transistor of said pair of bipolar transistors, the collectors of said pair of bipolar transistors each being connected respectively to a power source via said pair of load impedances, and a capacitance of each of said first pair of capacitors for blocking a flow of direct current are equal to each other, a capacitance of each of said second pair of capacitors for positive feedback are equal to each other, and an impedance of each of said pair of load impedances are equal to each other.

8. The oscillation circuit according to claim 2, wherein said one-port-type SAW resonator is connected between the bases of said pair of bipolar transistors, respectively.

9. The oscillation circuit according to claim 8, wherein said one-port-type SAW resonator is connected between the bases of said pair of bipolar transistors via a respective pair of capacitors for blocking a flow of direct current to said one-port-type SAW resonator.

10. The oscillation circuit according to claim 8, wherein said positive feedback circuit comprises a first capacitor which connects the emitter to the base of a first one of said pair of bipolar transistors; and a second capacitor which connects the emitter to the base of a second one of said pair of bipolar transistors.

11. The oscillation circuit according to claim 8, further comprising a constant current source, wherein the collectors of said pair of bipolar transistors are connected in common, with a common connection point being connected to a power source, and the emitters of said pair of bipolar transistors are grounded each via said constant-current circuit.

12. The oscillation circuit according to claim 8, wherein said one-port-type SAW resonator is connected between the bases of said pair of bipolar transistors via a respective first pair of capacitors for blocking a flow of direct current to said one-port-type SAW resonator, said positive feedback circuit comprises a second pair of capacitors for positive feedback, each of said pair of capacitors connects the emitter of one of said pair of bipolar transistors to the base of the other transistor of said pair of bipolar transistors, and a capacitance of each of said first pair of capacitors for blocking a flow of direct current are equal to each other, and a capacitance of each of said second pair of capacitors for positive feedback are equal to each other.

13. An oscillation method for generating a high-frequency signal, said method comprising the steps of:

positively feeding back an output of a differential amplifier having at least a pair of differentially connected active elements to an input of said differential amplifier; and causing a one-port-type SAW resonator connected between said pair of active elements of said differential amplifier to perform an oscillation operation.

14. The oscillation method according to claim 13, further comprising inputting the output from said pair of active elements to said one-port-type SAW resonator after removing direct current components.

15. The oscillation method according to claim 14, wherein said positive feedback is performed in such a way that an output from a collector of a first bipolar transistor which forms said differential amplifier is fed back to a base of a second bipolar transistor which forms said differential amplifier via a first capacitor, and that an output from a collector of said second bipolar transistor is fed back to a base of a first bipolar transistor via a second capacitor.

16. The oscillation method according to claim 14, wherein said positive feedback is performed in such a way that an output from an emitter of a first bipolar transistor which forms said differential amplifier is fed back to a base of the first bipolar transistor via a first capacitor, and that an output from an emitter of a second bipolar transistor which forms said differential amplifier is fed back to a base of the second bipolar transistor via a second capacitor.

* * * * *